United States Patent
Chen et al.

(10) Patent No.: US 10,164,613 B2
(45) Date of Patent: Dec. 25, 2018

(54) PHASE-INVERTED CLOCK GENERATION CIRCUIT AND REGISTER

(71) Applicant: Huawei Technologies Co., Ltd., Shenzhen (CN)

(72) Inventors: Qi Chen, Shenzhen (CN); Jianfu Zhong, Shenzhen (CN); Qiuling Zeng, Shanghai (CN); Yu Xia, Shenzhen (CN)

(73) Assignee: Huawei Technologies Co., Ltd, Shenzhen (CN)

( * ) Notice: Subject to any disclaimer, the term of this patent is extended or adjusted under 35 U.S.C. 154(b) by 0 days.

(21) Appl. No.: 15/676,788

(22) Filed: Aug. 14, 2017

(65) Prior Publication Data

US 2018/0048297 A1    Feb. 15, 2018

(30) Foreign Application Priority Data

Aug. 15, 2016   (CN) .......................... 2016 1 0672084

(51) Int. Cl.
*H03K 3/012* (2006.01)
*H03K 5/159* (2006.01)

(52) U.S. Cl.
CPC ............. *H03K 3/012* (2013.01); *H03K 5/159* (2013.01)

(58) Field of Classification Search
CPC ....................................................... H03K 3/012
See application file for complete search history.

(56) References Cited

U.S. PATENT DOCUMENTS

| 8,656,238 | B2 | 2/2014 | Lee et al. |
| 9,081,061 | B1 * | 7/2015 | Agarwal .......... G01R 31/31854 |
| 2010/0060321 | A1 | 3/2010 | Kvinta et al. |
| 2010/0308864 | A1 | 12/2010 | Lee et al. |
| 2013/0241617 | A1 | 9/2013 | Kim |

FOREIGN PATENT DOCUMENTS

| CN | 101685666 A | 3/2010 |
| CN | 103308851 A | 9/2013 |
| CN | 105071789 A | 11/2015 |

* cited by examiner

*Primary Examiner* — Daniel Puentes
(74) *Attorney, Agent, or Firm* — Slater Matsil, LLP

(57) ABSTRACT

A phase-inverted clock generation circuit is provided, where sources of a first PMOS and a second PMOS are connected to a power source, drains of the first PMOS and the second PMOS are connected to a source of a third PMOS, and a drain of the third PMOS is connected to a drain of a third NMOS; and the drain of the third PMOS is connected to a drain of a second NMOS, a source of the second NMOS is connected to a drain of a first NMOS, and a source of the first NMOS and a source of the third NMOS.

10 Claims, 7 Drawing Sheets

PHASE-INVERTED CLOCK GENERATION CIRCUIT AND REGISTER

CROSS-REFERENCE TO RELATED APPLICATIONS

This application claims priority to Chinese Patent Application No. 201610672084.2, filed on Aug. 15, 2016, which is hereby incorporated by reference in its entirety.

TECHNICAL FIELD

The present invention relates to the field of microelectronic circuit technologies, and in particular, to a phase-inverted clock generation circuit and a register.

BACKGROUND

Registers are some small storage areas inside a central processing unit (CPU) that are used to store data, and are used to temporarily store data for an operation and operation results. A register includes a latch or a trigger. Because one latch or trigger can store a 1-bit binary number, N latches or triggers can constitute an N-bit register, where N is a positive integer.

FIG. 1 shows a structural diagram of a circuit of an existing register. As shown in FIG. 1, the register includes a phase-inverted clock generation circuit, an input stage circuit, and two-stage latches (a first-stage latch and a second-stage latch shown in the figure). The phase-inverted clock generation circuit is configured to generate a phase-inverted clock signal. A clock signal and the phase-inverted clock signal are applied together to the input stage circuit, so as to control on and off of the input stage circuit by means of cooperation. The input stage circuit is configured to: import a data signal, and generate a signal for a latch to store. The register includes two working modes: a function mode and a test mode. In the function mode, the register works normally and stores data. In the test mode, a scan in (SI) signal is imported to test overall performance of the register. A specific working principle of the register is as follows: When a scan enable (SE) signal is 0, the register works in the function mode, and a phase-inverted clock signal (denoted as a C1 signal) is generated after a clock signal (denoted as a CP signal) undergoes specific delaying and phase inverting; or when an SE signal is 1, the register works in the test mode, and a CP signal and an SI signal are applied together to generate a C1 signal. The C1 signal, the CP signal, a data signal (denoted as a D signal), and the SE signal are applied together to the input stage circuit. The CP signal and the C1 signal together control the input stage circuit, so that the input stage circuit is turned on only within a short time after a rising edge of the CP signal arrives. The first-stage latch and the second-stage latch work in turn under control of the CP signal. After the rising edge of the CP signal arrives, the second-stage latch is turned off, and the first-stage latch is turned on; and after a falling edge of the CP signal arrives, the first-stage latch is turned off, and the second-stage latch is turned on. When the SE signal is 0 (that is, in the function mode), after the rising edge of the CP signal arrives, whether the input stage circuit is turned on is determined by a level of the D signal, and therefore a phase-inverted signal of the D signal is latched by the first-stage latch; and after the falling edge of the CP signal arrives, a value of the D signal is latched by the second-stage latch. When the SE signal is 1 (that is, in the test mode), after the rising edge of the CP signal arrives, whether the input stage circuit is turned on is unrelated to the D signal and is determined by a level of a C1 signal that is controlled by the SI signal, and therefore a value of the SI signal is latched by the first-stage latch; and after the falling edge of the CP signal arrives, a phase-inverted signal of the SI signal is latched by the second-stage latch.

In the circuit shown in FIG. 1, the phase-inverted clock generation circuit is the key. An existing phase-inverted clock generation circuit is shown in FIG. 2. When an SE signal is 0, a register works in a function mode, and a C1 signal is a signal generated after a CP signal undergoes delaying and phase inverting; or when an SE signal is 1, a register works in a test mode, a C1 signal is controlled by both a CP signal and an SI signal, and the C1 signal is 0 provided that at least one of the CP signal or the SI signal is 1. In this way, after a rising edge of the CP signal arrives, if the SI signal is 1, the C1 signal is 0, and the input stage circuit is turned off; if the SI signal is 0, the C1 signal is a phase-inverted signal obtained after the CP signal undergoes delaying, and the input stage circuit is turned on for a short time within a time period during which both the CP signal and the C1 signal are 1.

In the prior art, delaying and phase inverting of a CP signal are implemented by using two-stage phase inverters plus a NAND gate. Therefore, there are a large quantity of metal oxide semiconductor field effect transistors (MOS transistor for short) used in the existing phase-inverted clock generation circuit, and a circuit topology structure is quite complex, resulting in relatively high power consumption of a circuit.

SUMMARY

To resolve a problem of relatively high power consumption of a circuit caused by a large quantity of MOS transistors used in an existing phase-inverted clock generation circuit and a relatively complex circuit topology structure, embodiments of the present invention provide a phase-inverted clock generation circuit and a register.

According to a first aspect, a phase-inverted clock generation circuit is provided. The phase-inverted clock generation circuit includes a first p-channel metal oxide semiconductor field effect transistor (Positive channel Metal Oxide Semiconductor, PMOS transistor for short), a second PMOS transistor, a third PMOS transistor, a first n-channel metal oxide semiconductor field effect transistor (Negative channel Metal Oxide Semiconductor, NMOS transistor for short), a second NMOS transistor, a third NMOS transistor, and a first delay line circuit. Both sources of the first PMOS transistor and the second PMOS transistor are connected to a power source, both drains of the first PMOS transistor and the second PMOS transistor are connected to a source of the third PMOS transistor, and a drain of the third PMOS transistor is connected to a drain of the third NMOS transistor by using the first delay line circuit. The drain of the third PMOS transistor is further connected to a drain of the second NMOS transistor, a source of the second NMOS transistor is connected to a drain of the first NMOS transistor, and both a source of the first NMOS transistor and a source of the third NMOS transistor are grounded. Gates of the first PMOS transistor and the first NMOS transistor are input ends of an SI signal, gates of the second PMOS transistor and the second NMOS transistor are input ends of an SE signal, gates of the third PMOS transistor and the third NMOS transistor are input ends of a clock signal, and a connection node between the drain of the third PMOS transistor and the first delay line circuit is an output end of the phase-inverted clock generation circuit.

The phase-inverted clock generation circuit according to this embodiment of the present invention can provide the following functions: A first function is generating a phase-inverted clock signal, and a second function is importing a scan in signal. However, compared with an existing phase-inverted clock generation circuit shown in FIG. 2, a quantity of MOS transistors used in the phase-inverted clock generation circuit according to this embodiment is reduced, and a circuit topology structure is simpler, thereby reducing overall power consumption of a circuit.

A connection manner between the drain of the third PMOS transistor and the drain of the second NMOS transistor may include the following several possible implementations. In a first possible implementation, the drain of the third PMOS transistor is connected to the drain of the second NMOS transistor by using the first delay line circuit; in a second possible implementation, the drain of the third PMOS transistor is directly connected to the drain of the second NMOS transistor; and in a third possible implementation, the drain of the third PMOS transistor is connected to the second NMOS transistor by using a second delay line circuit.

For the first and the third possible implementations, delaying of the SI signal is implemented, helping to increase a hold time margin of the SI signal. In addition, compared with the third possible implementation, in the first possible implementation, a delay line circuit is reused, reducing a quantity of devices and costs required by a circuit.

In an example, a discharge rate of an NMOS transistor included in the phase-inverted clock generation circuit is less than a preset discharge rate. Optionally, the preset discharge rate is a discharge rate of an NMOS transistor included in an input stage circuit of a register including the phase-inverted clock generation circuit. For example, the NMOS transistor included in the phase-inverted clock generation circuit satisfies at least one of the following preset conditions: A threshold voltage is greater than a first threshold, a channel length is greater than a second threshold, or a channel width is less than a third threshold.

By using the foregoing manners, an MOS transistor of a low discharge rate is selected to construct a phase-inverted clock generation circuit, so that a discharge rate of a DB signal is greater than a discharge rate of a C1 signal, thereby ensuring that a register can work normally.

According to a second aspect, a register is provided, where the register includes the phase-inverted clock generation circuit according to the first aspect.

BRIEF DESCRIPTION OF THE DRAWINGS

To describe the technical solutions in the embodiments of the present invention more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

To make the objectives, technical solutions, and advantages of the present invention clearer, the following further describes the embodiments of the present invention in detail with reference to the accompanying drawings.

Figure 3:
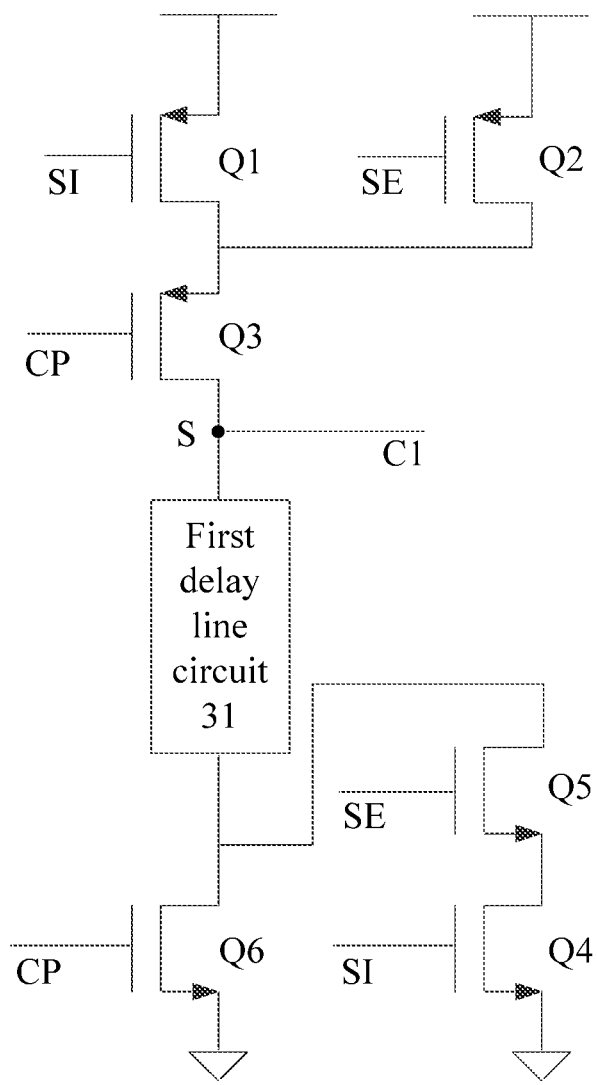
FIG. 3 is a schematic structural diagram of a phase-inverted clock generation circuit according to an embodiment of the present invention.

Referring to FIG. 3, FIG. 3 shows a schematic structural diagram of a phase-inverted clock generation circuit according to an embodiment of the present invention. The phase-inverted clock generation circuit includes a first PMOS transistor Q1, a second PMOS transistor Q2, a third PMOS transistor Q3, a first NMOS transistor Q4, a second NMOS transistor Q5, a third NMOS transistor Q6, and a first delay line circuit 31.

Both sources of the first PMOS transistor Q1 and the second PMOS transistor Q2 are connected to a power source, both drains of the first PMOS transistor Q1 and the second PMOS transistor Q2 are connected to a source of the third PMOS transistor Q3, and a drain of the third PMOS transistor Q3 is connected to a drain of the third NMOS transistor Q6 by using the first delay line circuit 31.

The drain of the third PMOS transistor Q3 is further connected to a drain of the second NMOS transistor Q5, a source of the second NMOS transistor Q5 is connected to a drain of the first NMOS transistor Q4, and both a source of the first NMOS transistor Q4 and a source of the third NMOS transistor Q6 are grounded.

Gates of the first PMOS transistor Q1 and the first NMOS transistor Q4 are input ends of an SI signal, gates of the second PMOS transistor Q2 and the second NMOS transistor Q5 are input ends of an SE signal, gates of the third PMOS transistor Q3 and the third NMOS transistor Q6 are input ends of a clock signal (denoted as a CP signal), and a connection node S between the drain of the third PMOS transistor Q3 and the first delay line circuit 31 is an output end of the phase-inverted clock generation circuit. The output end of the phase-inverted clock generation circuit outputs a phase-inverted clock signal. In this embodiment of the present invention, the phase-inverted clock signal is denoted as a C1 signal.

Figure 4:
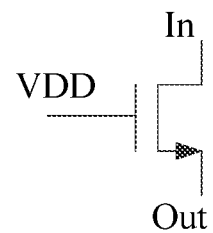
FIG. 4 is a schematic structural diagram of a delay line circuit according to an embodiment of the present invention.

The first delay line circuit 31 is configured to play a role of delaying the CP signal. The first delay line circuit 31 includes at least one NMOS transistor shown in FIG. 4. A drain of each NMOS transistor is an input end, a source thereof is an output end, and a gate thereof is connected to a power voltage. In an example, the first delay line circuit 31 includes one NMOS transistor. A drain of the NMOS transistor is an input end of the first delay line circuit 31, and the input end of the first delay line circuit 31 is connected to the drain of the third PMOS transistor Q3. A source of the NMOS transistor is an output end of the first delay line circuit 31, and the output end of the first delay line circuit 31 is connected to the drain of the third NMOS transistor Q6. In another example, the first delay line circuit 31 includes n serially-connected NMOS transistors. A source of the $i^{th}$ NMOS transistor is connected to a drain of the $(i+1)^{th}$ NMOS transistor, where i is a positive integer less than or equal to n−1, and n is an integer greater than 1. A drain of the $1^{st}$ NMOS transistor is an input end of the first delay line circuit 31, and the input end of the first delay line circuit 31 is connected to the drain of the third PMOS transistor Q3. A source of the $n^{th}$ NMOS transistor is an output end of the first delay line circuit 31, and the output end of the first delay line circuit 31 is connected to the drain of the third NMOS transistor Q6.

Figure 5:
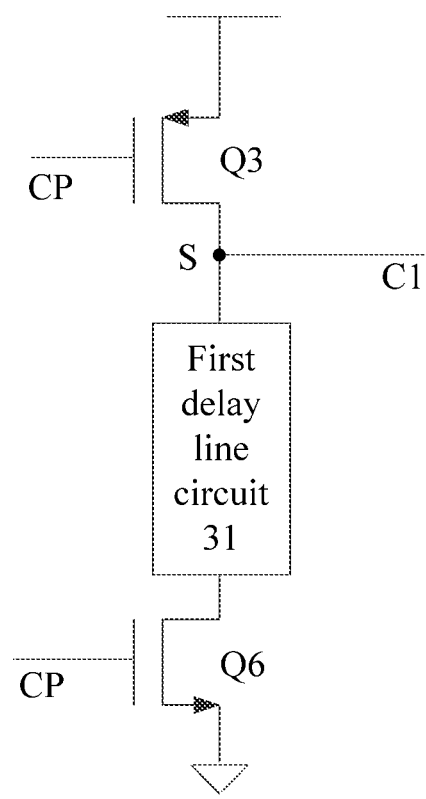
FIG. 5 is a schematic structural diagram of an equivalent circuit according to an embodiment of the present invention.

When the SE signal is 0, the phase-inverted clock generation circuit works in a function mode. When the SE signal is 0, the second PMOS transistor Q2 is turned on, the source of the third PMOS transistor Q3 is directly connected to the power source, and the second NMOS transistor Q5 is turned off. In this case, an equivalent circuit of the phase-inverted clock generation circuit is shown in FIG. 5 and forms a phase inverter. Due to existence of the first delay line circuit 31, the C1 signal is a signal generated after the CP signal undergoes delaying and phase inverting.

Figure 6:
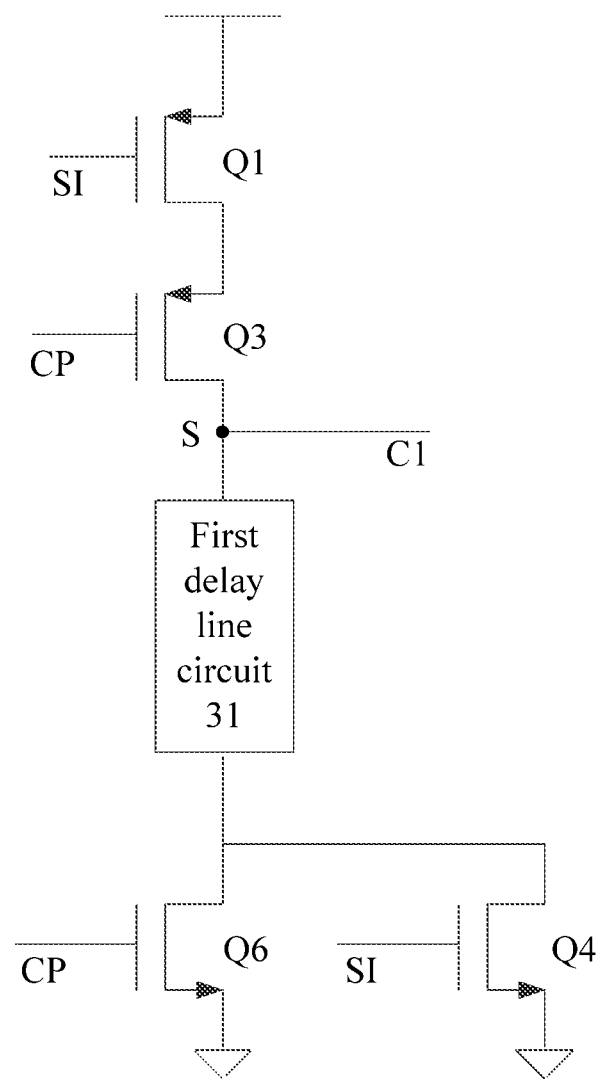
FIG. 6 is a schematic structural diagram of another equivalent circuit according to an embodiment of the present invention.

When the SE signal is 1, the phase-inverted clock generation circuit works in a test mode. When the SE signal is 1, the second PMOS transistor Q2 is turned off, and the second NMOS transistor Q5 is turned on. In this case, an equivalent circuit of the phase-inverted clock generation circuit is shown in FIG. 6. The C1 signal is controlled by both the CP signal and the SI signal, and the C1 signal is 0 provided that at least one of the CP signal or the SI signal is 1. In this way, after a rising edge of the CP signal arrives, if the SI signal is 1, the C1 signal is 0; if the SI signal is 0, the C1 signal is a phase-inverted signal obtained after the CP signal undergoes delaying.

Figure 2:
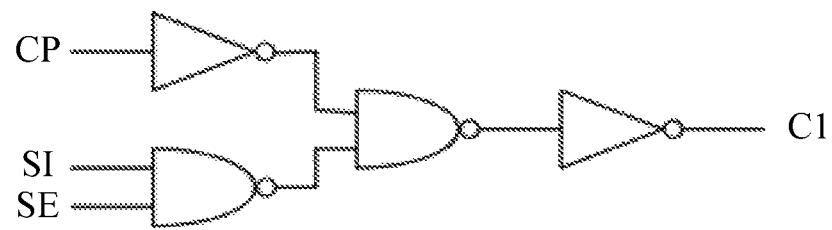
FIG. 2 is an existing phase-inverted clock generation circuit.

Therefore, the phase-inverted clock generation circuit according to this embodiment can provide the following functions: a first function is generating a phase-inverted clock signal, and a second function is importing a scan in signal. However, compared with an existing phase-inverted clock generation circuit shown in FIG. 2, a quantity of MOS transistors used in the phase-inverted clock generation circuit according to this embodiment is reduced, and a circuit topology structure is simpler, thereby reducing overall power consumption of a circuit.

In addition, a connection manner between the drain of the third PMOS transistor Q3 and the drain of the second NMOS transistor Q5 may include the following several possible implementations:

In a first possible implementation, as shown in FIG. 3, the drain of the third PMOS transistor Q3 is connected to the drain of the second NMOS transistor Q5 by using the first delay line circuit 31. That is, the input end of the first delay line circuit 31 is connected to the drain of the third PMOS transistor Q3, and the output end of the first delay line circuit 31 is connected to both the drain of the second NMOS transistor Q5 and the drain of the third NMOS transistor Q6.

Figure 7:
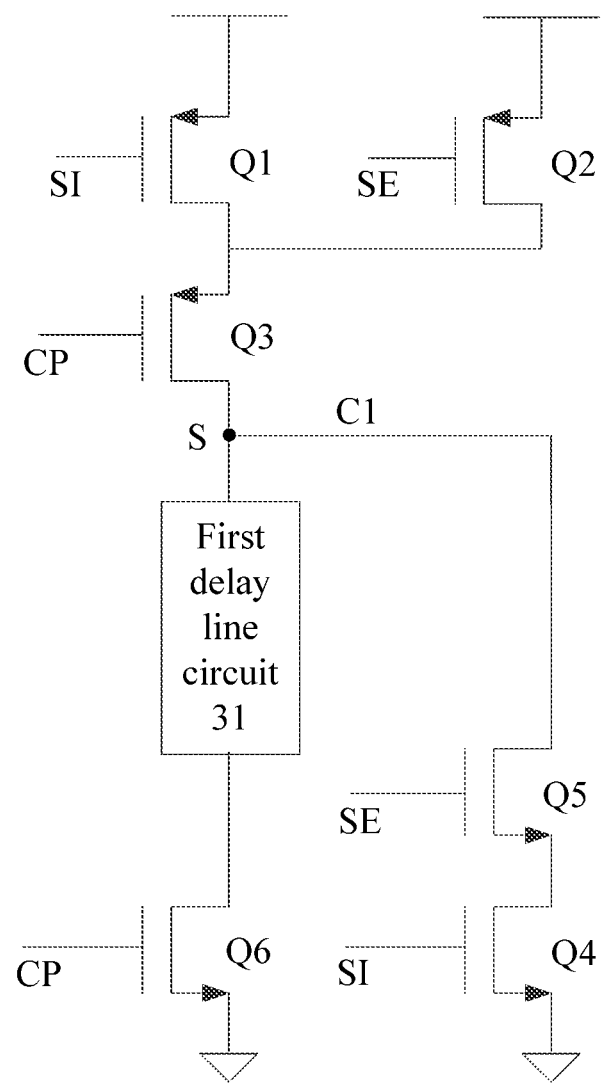
FIG. 7 is a schematic structural diagram of a phase-inverted clock generation circuit according to another embodiment of the present invention.

In a second possible implementation, as shown in FIG. 7, the drain of the third PMOS transistor Q3 is directly connected to the drain of the second NMOS transistor Q5.

Figure 8:
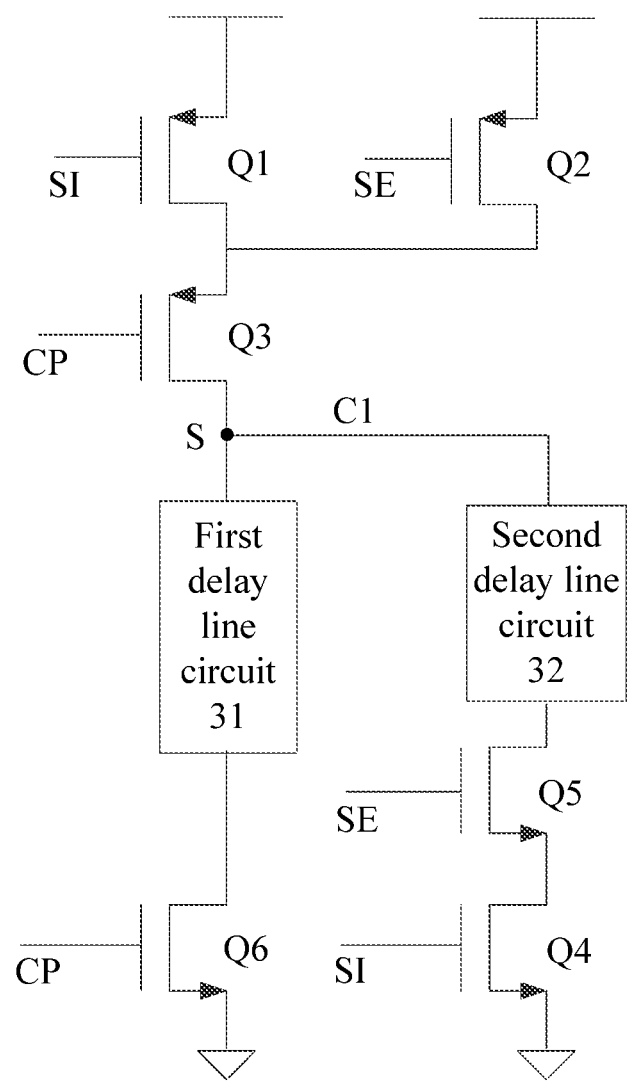
FIG. 8 is a schematic structural diagram of a phase-inverted clock generation circuit according to still another embodiment of the present invention.

In a third possible implementation, as shown in FIG. 8, the drain of the third PMOS transistor Q3 is connected to the second NMOS transistor Q5 by using a second delay line circuit 32. The second delay line circuit 32 includes at least one NMOS transistor shown in FIG. 4. A drain of each NMOS transistor is an input end, a source thereof is an output end, and a gate thereof is connected to a power voltage. In an example, the second delay line circuit 32 includes one NMOS transistor. A drain of the NMOS transistor is an input end of the second delay line circuit 32, and the input end of the second delay line circuit 32 is connected to the drain of the third PMOS transistor Q3. A source of the NMOS transistor is an output end of the second delay line circuit 32, and the output end of the second delay line circuit 32 is connected to the drain of the third NMOS transistor Q5. In another example, the second delay line circuit 32 includes m serially-connected NMOS transistors. A source of the $j^{th}$ NMOS transistor is connected to a drain of the $(j+1)^{th}$ NMOS transistor, where j is a positive integer less than or equal to m−1, and m is an integer greater than 1. A drain of the $1^{st}$ NMOS transistor is an input end of the second delay line circuit 32, and the input end of the second delay line circuit 32 is connected to the drain of the third PMOS transistor Q3. A source of the $m^{th}$ NMOS transistor is an output end of the second delay line circuit 32, and the output end of the second delay line circuit 32 is connected to the drain of the second NMOS transistor Q5.

For the first and the third possible implementations, delaying of the SI signal is implemented, helping to increase a hold time margin of the SI signal. In addition, compared with the third possible implementation, in the first possible implementation, a delay line circuit is reused, reducing a quantity of devices and costs required by a circuit.

In addition, in actual application, quantities of NMOS transistors included in the first delay line circuit 31 and the second delay line circuit 32 are determined according to two factors including stability and power consumption of a circuit. When a large quantity of NMOS transistors are used, stability of a circuit is enhanced, a process variation immunity capability of the circuit is improved, but an area and power consumption of the circuit are also increased. Therefore, in actual application, an appropriate quantity of NMOS transistors may be selected according to an actual design requirement to construct a delay line circuit.

An embodiment of the present invention further provides a register. The register includes the phase-inverted clock generation circuit according to the foregoing embodiment. In an example, a circuit structure diagram of the register may be shown in FIG. 1. The register includes a phase-inverted clock generation circuit, an input stage circuit, a first-stage latch, and a second-stage latch.

The phase-inverted clock generation circuit is configured to perform delaying and phase inverting on a clock signal (denoted as a CP signal), and an output end of the phase-inverted clock generation circuit outputs a phase-inverted clock signal (denoted as a C1 signal). The CP signal and the C1 signal are applied together to the input stage circuit, so as to control on and off of the input stage circuit by means of cooperation. For a circuit structure of the phase-inverted clock generation circuit, reference is made to the description and illustration of the foregoing embodiment, and details are not further described in this embodiment.

Figure 1:
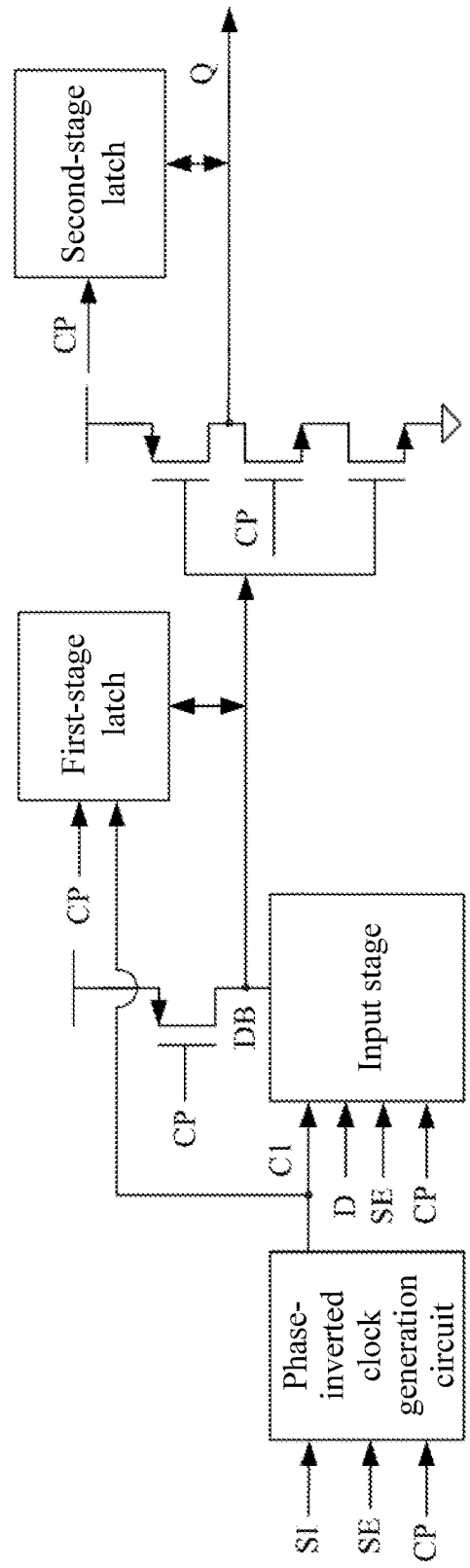
FIG. 1 is a circuit structure diagram of an existing register.

The input stage circuit is configured to: import a data signal, and generate a signal for a latch to store. As shown in FIG. 1, the input stage circuit is coupled to the output end of the phase-inverted clock generation circuit, and the input stage circuit is further coupled to output ends of a data signal (denoted as a D signal), an SE signal, and the CP signal.

Figure 9:
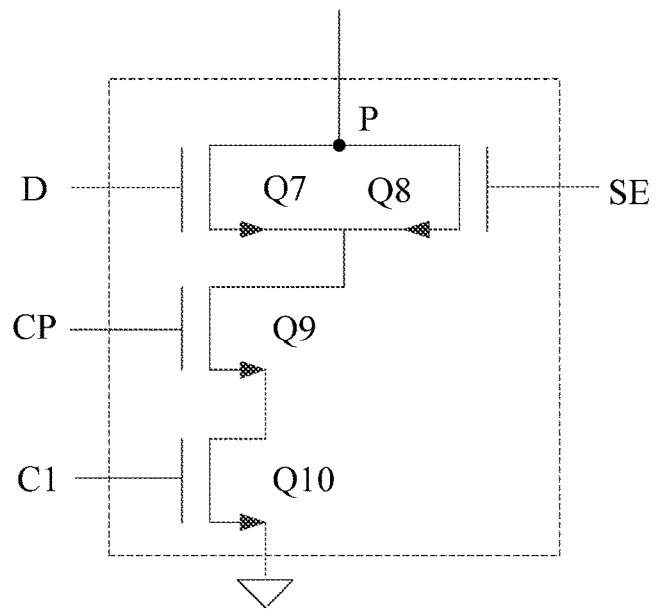
FIG. 9 is a schematic structural diagram of an input stage circuit according to an embodiment of the present invention.

With reference to FIG. 9, FIG. 9 shows a schematic structural diagram of the input stage circuit of the register shown in FIG. 1. The input stage circuit includes a fourth NMOS transistor Q7, a fifth NMOS transistor Q8, a sixth NMOS transistor Q9, and a seventh NMOS transistor Q10.

Both a source of the fourth NMOS transistor Q7 and a source of the fifth NMOS transistor Q8 are connected to a drain of the sixth NMOS transistor Q9, a source of the sixth NMOS transistor Q9 is connected to a drain of the seventh NMOS transistor Q10, and a source of the seventh NMOS transistor Q10 is grounded.

A gate of the fourth NMOS transistor Q7 is an input end of the D signal, a gate of the fifth NMOS transistor Q8 is an input end of the SE signal, a gate of the sixth NMOS transistor Q9 is an input end of the CP signal, and a gate of the seventh NMOS transistor Q10 is an input end of the C1 signal. A connection node P between a drain of the fourth NMOS transistor Q7 and a drain of the fifth NMOS transistor Q8 is an output end of the input stage circuit.

The register includes two working modes: a function mode and a test mode. In the function mode, the register works normally and stores data. In the test mode, an SI signal is imported, to test overall performance of the register. When the SE signal is 0, the register works in the function mode, and a C1 signal is generated after the CP signal undergoes specific delaying and phase inverting. When the SE signal is 1, the register works in the test mode, and the CP signal and the SI signal are applied together to generate a C1 signal. The C1 signal, the CP signal, the D signal, and the SE signal are applied together to the input stage circuit. The CP signal and the C1 signal together control the input stage circuit, so that the input stage circuit is turned on only within a short time after a rising edge of the CP signal arrives. The first-stage latch and the second-stage latch work in turn under control of the CP signal. After the rising edge of the CP signal arrives, the second-stage latch is turned off, and the first-stage latch is turned on; and after a falling edge of the CP signal arrives, the first-stage latch is turned off, and the second-stage latch is turned on. When the SE signal is 0 (that is, in the function mode), after the rising edge of the CP signal arrives, whether the input stage circuit is turned on is determined by a level of the D signal, and therefore a phase-inverted signal of the D signal is latched by the first-stage latch; and after the falling edge of the CP signal arrives, a value of the D signal is latched by the second-stage latch. When the SE signal is 1 (that is, in the test mode), after the rising edge of the CP signal arrives, whether the input stage circuit is turned on is unrelated to the D signal and is determined by a level of a C1 signal that is controlled by the SI signal, and therefore a value of the SI signal is latched by the first-stage latch; and after the falling edge of the CP signal arrives, a phase-inverted signal of the SI signal is latched by the second-stage latch.

Figure 10:
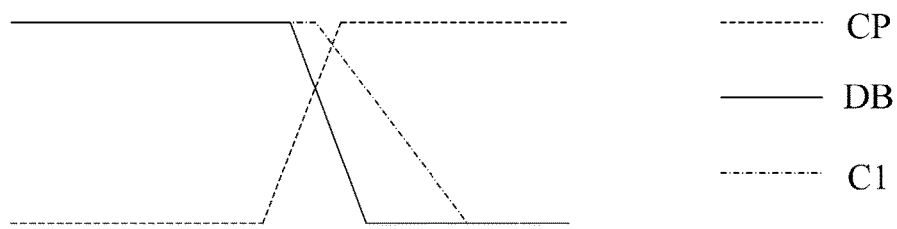
FIG. 10 is a schematic diagram of a discharge process of a DB signal and a C1 signal involved in an embodiment of the present invention.

To ensure that the register works normally, a discharge rate of a DB signal needs to be greater than a discharge rate of the C1 signal. With reference to FIG. 10, FIG. 10 shows a schematic diagram of a discharge process of the DB signal and the C1 signal. After the rising edge of the CP signal arrives, discharge is needed for both the C1 signal and the DB signal (it is assumed that an input D signal is 1). If the discharge rate of the DB signal is greater than the discharge rate of the C1 signal, it can be ensured that, before the C1 signal drops to a threshold voltage, the discharge process has been completed for the DB signal, thereby ensuring that a value of the DB signal can be latched by the first-stage latch.

Therefore, in actual application, to ensure that the register works normally, MOS transistors of different performance may be selected, to ensure that the discharge rate of the DB signal is greater than the discharge rate of the C1 signal. That is, a discharge rate of an NMOS transistor included in the phase-inverted clock generation circuit is less than a preset discharge rate. The preset discharge rate is a discharge rate of an NMOS transistor included in the input stage circuit of the register including the phase-inverted clock generation circuit.

For example, the NMOS transistor included in the phase-inverted clock generation circuit satisfies at least one of the following preset conditions: A threshold voltage is greater than a first threshold, a channel length is greater than a second threshold, or a channel width is less than a third threshold. Conversely, the NMOS transistor included in the input stage circuit satisfies at least one of the following preset conditions: A threshold voltage is less than a first threshold, a channel length is less than a second threshold, or a channel width is greater than a third threshold.

By using the foregoing manners, an MOS transistor of a low discharge rate is selected to construct a phase-inverted clock generation circuit, so that a discharge rate of a DB signal is greater than a discharge rate of a C1 signal, thereby ensuring that a register can work normally.

It should be additionally noted that, in this specification, "1" represents a high level and "0" represents a low level.

The sequence numbers of the foregoing embodiments of the present invention are merely for illustrative purposes, and are not intended to indicate priorities of the embodiments.

The foregoing descriptions are merely examples of embodiments of the present invention, but are not intended to limit the present invention. Any modification, equivalent replacement, and improvement made without departing from the spirit and principle of the present invention shall fall within the protection scope of the present invention.

What is claimed is:

1. A circuit, comprising:
a first Positive-Channel Metal Oxide Semiconductor (PMOS) transistor;
a second PMOS transistor;
a third PMOS transistor;
a first Negative-Channel Metal Oxide Semiconductor (NMOS) transistor;
a second NMOS transistor;
a third NMOS transistor; and
a first delay line circuit;
wherein sources of the first PMOS transistor and the second PMOS transistor are respectively connected to a power source, drains of the first PMOS transistor and the second PMOS transistor are respectively directly connected to a source of the third PMOS transistor, and a drain of the third PMOS transistor is connected to a drain of the third NMOS transistor by the first delay line circuit;
wherein the drain of the third PMOS transistor is further connected to a drain of the second NMOS transistor, a source of the second NMOS transistor is directly connected to a drain of the first NMOS transistor, and a source of the first NMOS transistor and a source of the third NMOS transistor are respectively grounded; and
wherein gates of the first PMOS transistor and the first NMOS transistor are input ends of a scan in (SI) signal, gates of the second PMOS transistor and the second NMOS transistor are input ends of a scan enable (SE) signal, gates of the third PMOS transistor and the third NMOS transistor are input ends of a clock signal, and a connection point between the drain of the third PMOS transistor and the first delay line circuit is an output end of the circuit.

2. The circuit according to claim 1, wherein the drain of the third PMOS transistor is connected to the drain of the second NMOS transistor by the first delay line circuit.

3. The circuit according to claim 1, wherein the drain of the third PMOS transistor is directly connected to the drain of the second NMOS transistor.

4. The circuit according to claim 1, wherein the drain of the third PMOS transistor is connected to the drain of the second NMOS transistor by a second delay line circuit.

5. The circuit according to claim 4, wherein the second delay line circuit comprises one NMOS transistor, wherein a drain of the one NMOS transistor is an input end of the second delay line circuit, and the input end of the second delay line circuit is connected to the drain of the third PMOS transistor, and wherein a source of the one NMOS transistor is an output end of the second delay line circuit, and the output end of the second delay line circuit is connected to the drain of the second NMOS transistor; or wherein the second delay line circuit comprises m serially-connected NMOS transistors, and a source of a $j^{th}$ NMOS transistor of the m serially-connected NMOS transistors is connected to a drain of a $(j+1)^{th}$ NMOS transistor of the m serially-connected NMOS transistors, wherein j is a positive integer less than or equal to m−1, and m is an integer greater than 1, wherein a drain of a first NMOS transistor of the m serially-connected NMOS transistors is an input end of the second delay line circuit, and the input end of the second delay line circuit is connected to the drain of the third PMOS transistor, and wherein a source of a $m^{th}$ NMOS transistor of the m serially-connected NMOS transistors is the output end of the second delay line circuit, and the output end of the second delay line circuit is connected to the drain of the second NMOS transistor.

6. The circuit according to claim 1, wherein the first delay line circuit comprises one NMOS transistor, wherein a drain of the one NMOS transistor is an input end of the first delay line circuit, and the input end of the first delay line circuit is connected to the drain of the third PMOS transistor, and wherein a source of the one NMOS transistor is an output end of the first delay line circuit, and the output end of the first delay line circuit is connected to the drain of the third NMOS transistor; or wherein the first delay line circuit comprises n serially-connected NMOS transistors, and a source of an $i^{th}$ NMOS transistor is connected to a drain of an $(i+1)^{th}$ NMOS transistor, wherein i is a positive integer less than or equal to n−1, and n is an integer greater than 1, wherein a drain of a first NMOS transistor of the n serially-connected NMOS transistors is an input end of the first delay line circuit, and the input end of the first delay line circuit is connected to the drain of the third PMOS transistor, and wherein a source of a $n^{th}$ NMOS transistor of the n serially-connected NMOS transistors is the output end of the first delay line circuit, and the output end of the first delay line circuit is connected to the drain of the third NMOS transistor.

7. The circuit according to claim 1, wherein a discharge rate of an NMOS transistor comprised in the circuit is less than a preset discharge rate.

8. The circuit according to claim 7, wherein the preset discharge rate is a discharge rate of an NMOS transistor comprised in an input stage circuit of a register comprising the circuit.

9. The circuit according to claim 7, wherein an NMOS transistor comprised in the circuit satisfies at least one of: a threshold voltage is greater than a first threshold, a channel length is greater than a second threshold, or a channel width is less than a third threshold.

10. A register, comprising a circuit, the circuit comprising:
a first Positive-Channel Metal Oxide Semiconductor (PMOS) transistor;
a second PMOS transistor;
a third PMOS transistor;
a first Negative-Channel Metal Oxide Semiconductor (NMOS) transistor;
a second NMOS transistor;
a third NMOS transistor; and
a first delay line circuit;
wherein sources of the first PMOS transistor and the second PMOS transistor are respectively connected to a power source, drains of the first PMOS transistor and the second PMOS transistor are respectively directly connected to a source of the third PMOS transistor, and a drain of the third PMOS transistor is connected to a drain of the third NMOS transistor by the first delay line circuit;
wherein the drain of the third PMOS transistor is further directly connected to a drain of the second NMOS transistor, a source of the second NMOS transistor is directly connected to a drain of the first NMOS transistor, and a source of the first NMOS transistor and a source of the third NMOS transistor are respectively grounded; and
wherein gates of the first PMOS transistor and the first NMOS transistor are input ends of a scan in (SI) signal, gates of the second PMOS transistor and the second NMOS transistor are input ends of a scan enable (SE) signal, gates of the third PMOS transistor and the third NMOS transistor are input ends of a clock signal, and a connection point between the drain of the third PMOS transistor and the first delay line circuit is an output end of the circuit.

* * * * *